(12) United States Patent
Mazzola et al.

(10) Patent No.: US 7,907,001 B2
(45) Date of Patent: Mar. 15, 2011

(54) HALF-BRIDGE CIRCUITS EMPLOYING NORMALLY ON SWITCHES AND METHODS OF PREVENTING UNINTENDED CURRENT FLOW THEREIN

(75) Inventors: Michael S. Mazzola, Starkville, MS (US); Robin Kelley, Starkville, MS (US)

(73) Assignee: SemiSouth Laboratories, Inc., Starkville, MS (US)

( * ) Notice: Subject to any disclaimer, the term of this patent is extended or adjusted under 35 U.S.C. 154(b) by 0 days.

(21) Appl. No.: 12/557,199

(22) Filed: Sep. 10, 2009

(65) Prior Publication Data

US 2010/0026370 A1 Feb. 4, 2010

Related U.S. Application Data

(62) Division of application No. 11/802,388, filed on May 22, 2007, now Pat. No. 7,602,228.

(51) Int. Cl.
*H03K 17/56* (2006.01)
(52) U.S. Cl. .......................... 327/423; 327/424; 327/430
(58) Field of Classification Search ................. 327/112, 327/419, 420, 423, 424, 430
See application file for complete search history.

(56) References Cited

U.S. PATENT DOCUMENTS 7,248,093 B2 * 7/2007 West .............................. 327/424
7,602,228 B2 * 10/2009 Mazzola et al. ............... 327/423

OTHER PUBLICATIONS

Orellana, et al., "Fast gate drive for SiC-JFET using a conventional driver for MOSFETs and additional protections," Industrial Electronics Society, vol. 1, pp. 938-943 (2004).
Ossmann, "Small DC-DC converters DC-DC converters under the magnifying glass," Elektor Electronics, vol. 29, No. 317, pp. 54-58 (2003).
Mohan, et al., "Power electronics: Converters, Applications and Design," John Wiley and Sons, Inc. XP002500632, pp. 184-188, figure 7.25 (2003).
Rebbereh, et al., "First inverter using silicon carbide power switches only," 10th European Conference on Power Electronics and Applications, XP008097914, ISBN 90-75815-07-7, Section "Inverter Topology," figure 2 (2003).
Robin Kelley, et al., "Inherently Safe Resonant Reset Forward Converter Using a Bias-Enhanced SiC JFET," Materials Science Forum, vols. 527-529 (2006), pp. 1211-1214.
Robin Kelley, et al., "Inherently Safe Resonant Reset Forward Converter Using a Bias-Enhanced SiC JFET," abstract p. 53, ICSCRM 2005, Sep. 2005.

(Continued)

*Primary Examiner* — Long Nguyen
(74) *Attorney, Agent, or Firm* — Morris, Manning & Martin, LLP; Christopher W. Raimund

(57) ABSTRACT

A method for rendering a half-bridge circuit containing normally on switches such as junction field effect transistors (JFETs) inherently safe from uncontrolled current flow is described. The switches can be made from silicon carbide or from silicon. The methods described herein allow for the use of better performing normally on switches in place of normally off switches in integrated power modules thereby improving the efficiency, size, weight, and cost of the integrated power modules. As described herein, a power supply can be added to the gate driver circuitry. The power supply can be self starting and self oscillating while being capable of deriving all of its source energy from the terminals supplying electrical potential to the normally on switch through the gate driver. The terminal characteristics of the normally on switch can then be coordinated to the input-to-output characteristics of the power supply.

11 Claims, 6 Drawing Sheets

OTHER PUBLICATIONS

R. L. Kelley, et al., "Inherently Safe DC/DC Converter using a Normally-on SiC JFET," Applied Power Electronics Conference and Exposition, 2005, APEC 2005, Twentieth Annual IEEE, publication date: Mar. 6-10, 2005; vol. 3; pp. 1561-1565 vol. 3.

Robin Kelley, "High Side Gate Driver for Providing Inherent Safety to Normally on SiC JFETs in Motor Drive Applications," ECE 7000, Scalable SiC Devices, DIS, Dec. 9, 2005, pp. 1-6.

M. S. Mazzola, et al., "Scalable SiC Power Switches for Applications in More Electric Vehicles," Pro. of 6th Int. All Electric Combat Vehicle Conf., AECV 2005, Bath, England, Jun. 13-16, 2005 (7 pages).

H. Akagi et al., "130 kHz 7.5 kW Current Source Inverters Using Static Induction Transistors for Induction Heating Applications," IEEE Transactions on Power Electronics, 3(3), 1988, pp. 303-309.

M. Rashid, "Insulated Gate Bipolar Transistor," Power Electronics Handbook, ed. M. Rashid, Academic Press, ISBN 0-12-58 i 650-2, 200 I, pp. 109-110.

N. Mohan, et al., "Power Electronics," Wiley, ISBN 0-471-58408-8, 1995, p. 225.

Issa Batarseh, "Power Electronic Circuits," Wiley, ISBN 0-47 i-12662-4, 2004, pp. 426-427.

Issa Batarseh, "Power Electronic Circuits," Wiley, ISBN 0-471-12662-4, 2004, pp. 224-225.

* cited by examiner

HALF-BRIDGE CIRCUITS EMPLOYING NORMALLY ON SWITCHES AND METHODS OF PREVENTING UNINTENDED CURRENT FLOW THEREIN

This application is a divisional application of U.S. patent application Ser. No. 11/802,388, filed May 22, 2007, now U.S. Pat. No. 7,602,228.

BACKGROUND

1. Technical Field

This application relates generally to half-bridge circuits employing normally on switches and to electrical devices which include one or more such circuits.

2. Background of the Technology

Silicon Carbide (SiC), a wide band-gap semiconductor material, is very attractive for use in high-power, high-temperature, and/or radiation resistant electronics. SiC power switches are logical candidates for these applications due to their excellent material physical properties such as wide energy band-gap, high breakdown field strength, high saturated electron drift velocity and high thermal conductivity compared to the conventional silicon counter part. In addition to the above advantages, SiC power devices can operate with much lower specific on-resistance than conventional silicon power devices [1]. Because of these properties, SiC unipolar devices are expected to displace silicon bipolar switches (such as the insulated gate bipolar transistor or IGBT) and rectifiers in the 600-3000 V range.

A necessary component to the value proposition that the market demands to adopt the new SiC switch technology is found in the lower specific on resistance of SiC switches. A factor of ten or more reduction is inherent to SiC devices, but only in the form most likely to produce these specific on-resistance reductions. The SiC junction field effect transistor (JFET) has demonstrated the lowest specific on-resistance of any SiC switch. In particular, the normally on version of this device will minimize the specific on-resistance at any voltage rating. The market place, however, tends to prefer normally off devices because they are perceived as being inherently safe when imbedded in an application.

An independent trend in the market place is to package powerful switches into modules that typically consist of two, four, or six switches arranged in parallel half-bridge configurations. These modules are particularly useful for the control of rotating machinery in devices known as motor drives, the operating principals of which are well known [2, 3]. FIG. 1 illustrates a single half-bridge module containing two silicon IGBT switches. Typical ratings for the switches in the modules are 600-V or 1200-V blocking potential and hundreds of amperes of conduction (e.g., 300-A, 400-A, or 600-A) but the voltages and currents can be higher or lower. The half-bridge interconnection and the constituent IGBT both have weaknesses. The former requires the added complication of an isolated gate driver for the high-side switch. The latter has a gate terminal that can be easily damaged by incorrect or excessively stressful control potentials. The latter also has many other failure modes which designers must avoid when designing applications, principally by making design tradeoffs in the circuitry known as the gate drive. The market has responded by including imbedded gate driver circuitry into the switch modules so that the application external to the module does not actually apply potentials to the gate terminals of the IGBTs. This additional level of safety has dramatically increased the reliability of IGBTs used in the field.

There still exists a need, however, for improved circuits and devices which modulate the flow of electrical current from one or more electrical sources to one or more electrical loads.

SUMMARY

According to a first embodiment, a circuit is provided which comprises:

a first normally-on switch having a source, a drain and a gate, the source of the first normally-on switch electrically connected to a load and the drain of the first normally-on switch electrically connected to a supply voltage;

a second normally-on switch having a source, a drain, and a gate, the source of the second normally-on switch electrically connected to a common voltage and the drain of the second normally-on switch electrically connected to the load;

a first gate driver electrically connected between the gate and the source of the first normally-on switch;

a second gate driver electrically connected between the gate and the source of the second normally-on switch; and a first oscillating power supply electrically connected in parallel across the drain and the source of the first switch, the first power supply configured to power the first gate driver such that, for a given voltage applied to the input to the first power supply, the first power supply generates an output voltage which can be supplied to the gate of the first switch by the first gate driver;

a second oscillating power supply electrically connected in parallel across the drain and the source of the second switch, the second power supply configured to power the second gate driver such that, for a given voltage applied to the input to the second power supply, the second power supply generates an output voltage which can be supplied to the gate of the second switch by the second gate driver.

The input-output characteristics of the first power supply can be coordinated with the characteristics of the first switch such that the first switch is in active current limiting mode over at least 50 percent of a voltage range of 0 to the breakdown voltage of the first switch applied to the power supply and wherein the input-output characteristics of the second power supply are coordinated with the characteristics of the second switch such that the second switch is in active current limiting mode over at least 50 percent of a voltage range of 0 to the breakdown voltage of the second switch applied to the second power supply.

The input-output characteristics of the first power supply can be coordinated with the characteristics of the first switch such that the first switch is in active current limiting mode over at least 75 percent of a voltage range of 0 to the breakdown voltage of the first switch applied to the power supply and wherein the input-output characteristics of the second power supply are coordinated with the characteristics of the second switch such that the second switch is in active current limiting mode over at least 75 percent of a voltage range of 0 to the breakdown voltage of the second switch applied to the second power supply.

The input-output characteristics of the first oscillating power supply can be coordinated with the characteristics of the first switch such that the first switch does not overheat when in passive current limiting mode and wherein the input-output characteristics of the second oscillating power supply are coordinated with the characteristics of the second switch such that the second switch does not overheat when in passive current limiting mode.

The first gate driver and the second gate driver can each comprise a totem pole driver.

A device is also provided comprising three circuits as set forth above arranged in parallel, wherein the device is a three-phase motor drive.

The circuit can further comprise an external controller which is adapted to bias the first switch to minimum on-resistance via the first gate driver. The first gate driver can be adapted to apply a bias voltage to the gate of the first switch ($V_{GS}$) which is equal to the output from the first power supply ($-V_{SS}$) when the external controller is not biasing the first switch to minimum on resistance.

According to a second embodiment, a circuit is provided which comprises:

a first normally-on switch having a source, a drain and a gate, the source of the first normally-on switch electrically connected to a load and the drain of the first normally-on switch electrically connected to a supply voltage;

a second normally-on switch having a source, a drain, and a gate, the source of the second normally-on switch electrically connected to a common voltage and the drain of the second normally-on switch electrically connected to the load;

a first gate driver electrically connected between the gate and the source of the first normally-on switch;

a second gate driver electrically connected between the gate and the source of the second normally-on switch; and an oscillating power supply electrically connected across the voltage source and the common voltage, wherein the power supply is configured to power the first and second gate drivers such that, for a given voltage applied to the input of the power supply, the power supply generates a first output voltage which can be supplied to the gate of the first switch by the first gate driver and a second output voltage which can be supplied to the gate of the second switch by the second gate driver.

According to a third embodiment, an electrical device comprising at least one circuit as set forth above is also provided.

According to a fourth embodiment, an electrical device comprising three circuits as set forth above arranged in parallel wherein the device is a three-phase motor drive is also provided.

BRIEF DESCRIPTION OF THE DRAWINGS

As shown in FIG. 3, a power supply is connected across the input to the drain and source terminals of each JFET. The input-to-output characteristics of the power supply can be coordinated with the blocking characteristics of the JFET.

DETAILED DESCRIPTION

Figure 1:
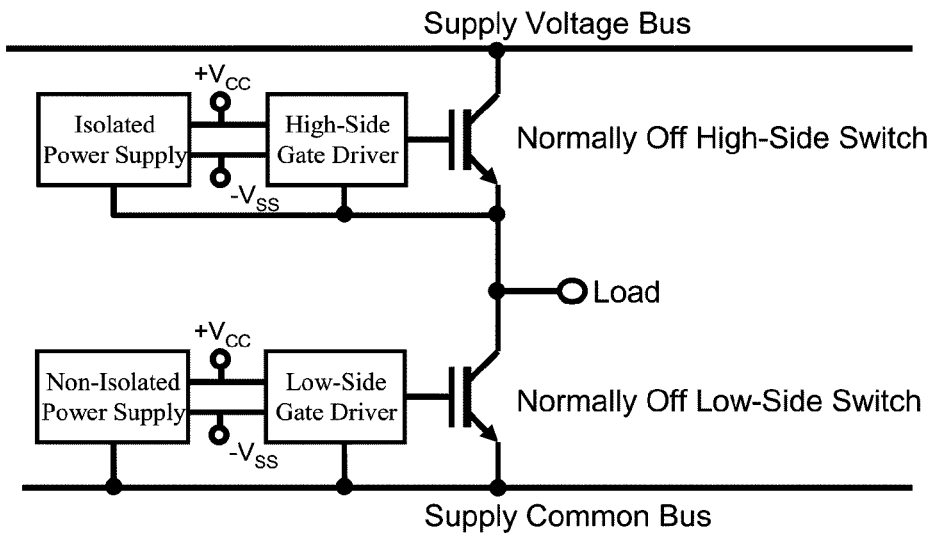
FIG. 1 is an example of a half-bridge switch module consisting of a silicon IGBT (normally off high-side switch) in series with a second IGBT (normally off low-side switch). The module shown in FIG. 1 can also include an anti-parallel diode rectifier (not shown). Isolated power supplies can be used to derive negative and positive potentials to drive the insulated gate of the switch.

A method for rendering the use of normally on switches inherently safe when packaged in a module consisting of one or more switches that are in turn arranged and controlled so as to modulate the flow of electrical current from one or more electrical sources to one or more electrical loads is described. The switches can be made from a semiconductor material such as silicon or silicon carbide. The normally on switch can be a junction field effect transistor (JFET), but the methods are not limited to such switches. Any normally on switch that exhibits a proportional relationship between the potential applied across the control terminals of the device and the potential that the device can block across the controlled terminals of the device without the flow of excessive leakage current can be rendered safe by the methods described herein.

A described herein, a circuit can be added to the gate drive circuitry of each switch in the module such that a normally on switch can have the same inherent safety, from the point of view of the external terminals of the module, that is usually available only from a normally off switch. In this way, better performing normally on switches can be used in the module without compromising the safety, or the perception of safety, in the eyes of the application designer. Furthermore, the circuitry can be coordinated with the physical properties of the switch to ensure a safe (i.e., non-damaging) response to any potential applied to the switch. An exemplary, non-limiting example of the normally on switch is a silicon carbide power JFET.

As set forth above, a method for rendering a half-bridge circuit containing normally on switches, such as junction field effect transistors (JFETs) made, for example, from silicon carbide or from silicon, inherently safe from uncontrolled current flow (i.e., "shoot through") is provided. The methods described herein allow for the use of better performing normally on switches in place of normally off switches in integrated power modules thereby improving the efficiency, size, weight, and cost of such integrated power modules.

As set forth herein, a power supply may be added to the gate driver circuitry. The power supply may be self starting and self oscillating while being capable of deriving all of its source energy from the terminals supplying electrical potential to the normally on switch. Such a configuration is common to a wide class of devices known as integrated power modules. The methods described herein, however, are not limited to integrated power modules. Rather, these methods are applicable to any system consisting of one or more half-bridge circuits. A common example is the three-phase electric motor drive, which uses three half-bridge circuits in parallel.

As also described herein, the terminal characteristics of the normally on switch can be coordinated to the input-to-output characteristics of the power supply. The details of the coordination and the results from a working model are described below.

An object of the present invention is to illustrate a means for rendering normally on power semiconductor switches with the same inherent safety against potentially damaging unintended flow of electrical current that is provided by the normally off switches.

A further object of the invention is to describe the interconnection of additional circuitry in the gate driver portion of the typical power switch module that provides one aspect of the means for rendering normally on switches inherently safe.

A further object of the invention is to describe the coordination between the properties of the additional circuitry and the properties of the normally on power switch that results in the inherently safe design.

A further object of the invention is to describe the constraints that define the "crossover" between active current limiting, which is provided by the additional circuitry mentioned above, and passive current limiting, which is provided by the normally on power switch itself.

As described herein, the result of these various objects is a means of rendering the normally on power switch inherently safe that is robust, technically feasible, and consistent with current and future design practice in power modules.

The benefits of the current invention are considerable. For example, better performing normally on power switches can be used in power modules, especially when the switches are made from silicon carbide, which will shrink the size and weight of these modules and make them more efficient. In addition, it is likely that more applications for power modules will become possible because of the faster switching performance typical of unipolar devices over bipolar devices.

The present invention will be described in greater detail hereafter with reference to the accompanying drawings, in which a preferred embodiment of the invention is described with silicon carbide (SiC) normally on Junction Field Effect Transistors (JFETs).

By "normally on" it is meant a transistor switch that will conduct significant current when no voltage or current bias is applied to the gating terminal of the transistor.

Silicon carbide crystallizes in more than 200 different poly-types. The most important are: 3C—SiC (cubic unit cell, zincblende); 2H—SiC; 4H—SiC; 6H—SiC (hexagonal unit cell, wurtzile); and 15R—SiC (rhombohedral unit cell). However, the 4H-polytype is more attractive for power devices thanks to its larger bandgap and higher electron mobility. Although 4H—SiC is preferred, it is to be understood that the present invention is applicable to devices made of other poly-types of silicon carbide or made from elemental silicon, by way of example.

Referring to FIG. 1, an example schematic of a two-switch half bridge commonly used by itself as a power processor in numerous power electronic applications (e.g., dc-dc converter [1] and dc-ac inverters [2]) or as a building block for three-phase inverters which typically requires three half-bridge circuits in parallel [3]. The switches illustrated in FIG. 1 are normally off insulated gate bipolar transistors (IGBT). In modules spanning the range of voltage ratings from 600 V to thousands of volts and spanning the range of current ratings from 50 A to thousands of amperes, the silicon IGBT is most common. While a negative gate potential is not generally required to cause the IGBT switch to be in the non-conducting state, FIG. 1 includes the possibility of a negative potential ($-V_{SS}$ in FIG. 1) because this is known to improve the efficiency of switching certain types of IGBTs in applications [4].

New switch technology in the form of normally on SiC JFETs have exhibited the lowest specific on-resistance and the lowest gate charge figures of merit among power semiconductor devices with voltage ratings substantially above 300 V, and thus have the potential to displace silicon IGBTs in many of their current and future applications [5]. The advantages of using a unipolar device, like the SiC JFET, over a bipolar device, like the Si IGBT, can accrue benefits such as better switching response, lower forward conduction loss, and relaxed thermal management. In contrast, traditional silicon unipolar devices such as the MOSFET simply cannot deliver low enough forward conduction loss to compete with the silicon IGBT, especially at voltages above 600-V. Non-traditional normally on silicon and silicon carbide unipolar devices are competitive, the latter extremely so.

Figure 2:
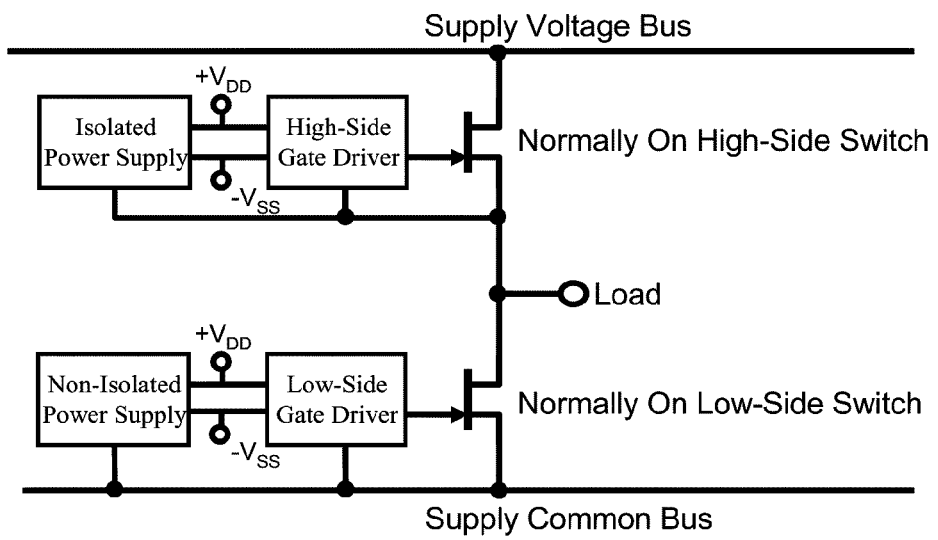
FIG. 2 is an example of a half-bridge switch module comprising a normally on switch such as a junction field effect transistor (JFET) in series with a second normally on switch. The module shown in FIG. 2 can also include an anti-parallel diode rectifier (not shown). Isolated power supplies can be used to derive negative and positive potentials to drive the insulated gate of the switch.

As illustrated in FIG. 2, a normally on silicon JFET (also known as the static induction transistor or SIT) has been used to make power inverters [6]. However, for these devices the negative potential required to pinch-off a normally on switch and thus render it in the non-conducting state is derived from the power supply powering the gate driver in a manner similar to that commonly provided for normally off switches. The disadvantage of this approach is that if the source of isolated power is removed (e.g., by accident or by failure) then the means for supplying the necessary negative potential is also removed. This can leave the half bridge made from normally on switches in an uncontrolled conducting state which can severely damage the semiconductor switches and/or the external load or source by permitting uncontrolled and excessive electrical current flow (sometimes referred to as "shoot through"). This concern, above all, has favored the silicon IGBT over the silicon JFET in virtually all practical applications.

Figure 3:
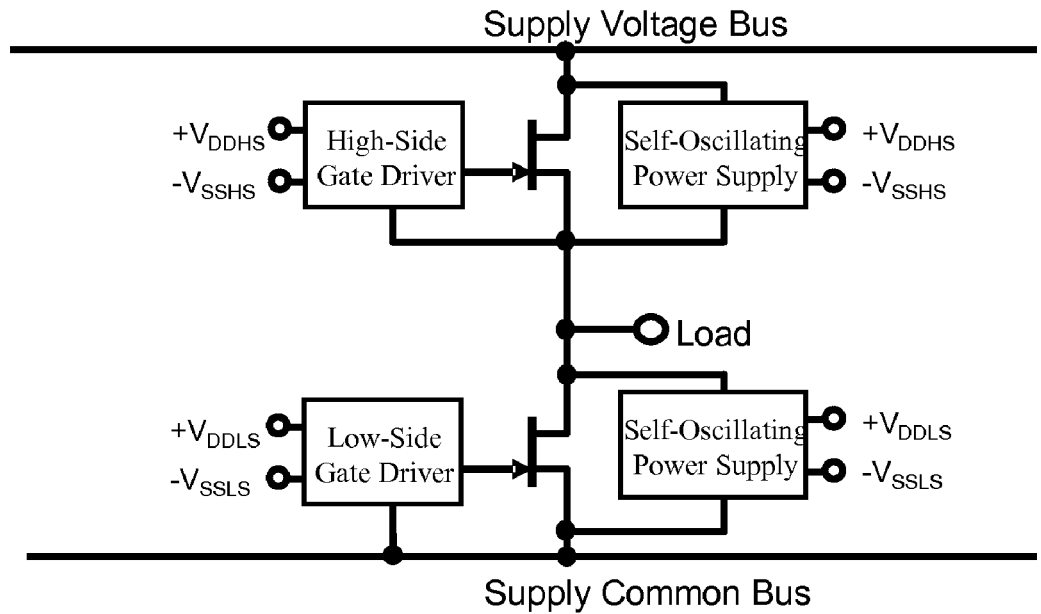
FIG. 3 is a schematic diagram of a power half-bridge circuit comprising a normally on junction field effect transistor (JFET) made from silicon carbide in the high and low side switch positions.
Figure 11:
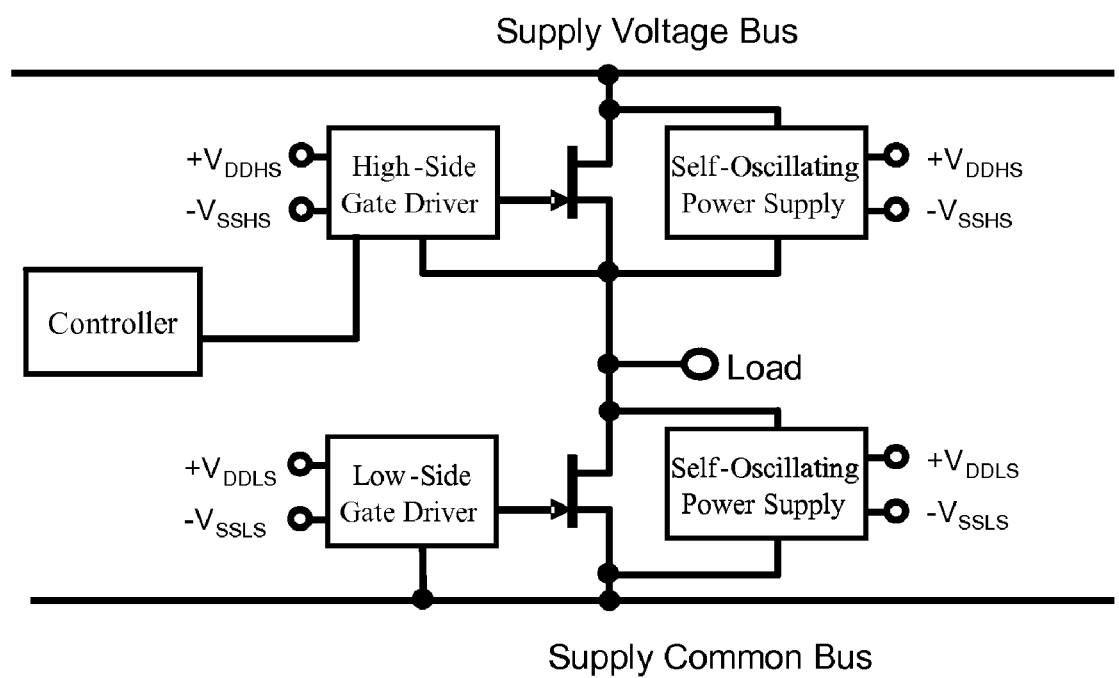
FIG. 11 shows schematically a diagram of a power half-bridge circuit having an external controller adapted to bias the first switch to minimum on-resistance via the first gate driver.

Referring now to FIG. 3, a schematic block diagram is shown for a power half-bridge circuit comprising a normally on junction field effect transistor (JFET) made from silicon carbide in the high and low side switch positions. The provision of negative gate potential is no longer dependent on an isolated power source, although one can still be provided as a means of redundancy. Instead, or in addition, a power supply is connected across the drain and the source terminals of the normally on switch (e.g., a JFET as depicted in FIG. 3). This power supply can have input-to-output characteristics which are coordinated with the electrical characteristics of the JFET in a manner described below. This coordination can be used to ensure that, for any combination of electrical potentials applied across the drain and source terminals of the JFET, an uncontrolled electrical current cannot flow through the JFET. In FIG. 3, two power supplies are shown, one for each switch of the half bridge. This arrangement provides maximum protection to each JFET. In one embodiment, as shown in FIG. 11, the power half-bridge circuit includes an external controller that is configured to bias the first switch to minimum on-resistance via the first gate driver.

Figure 4:
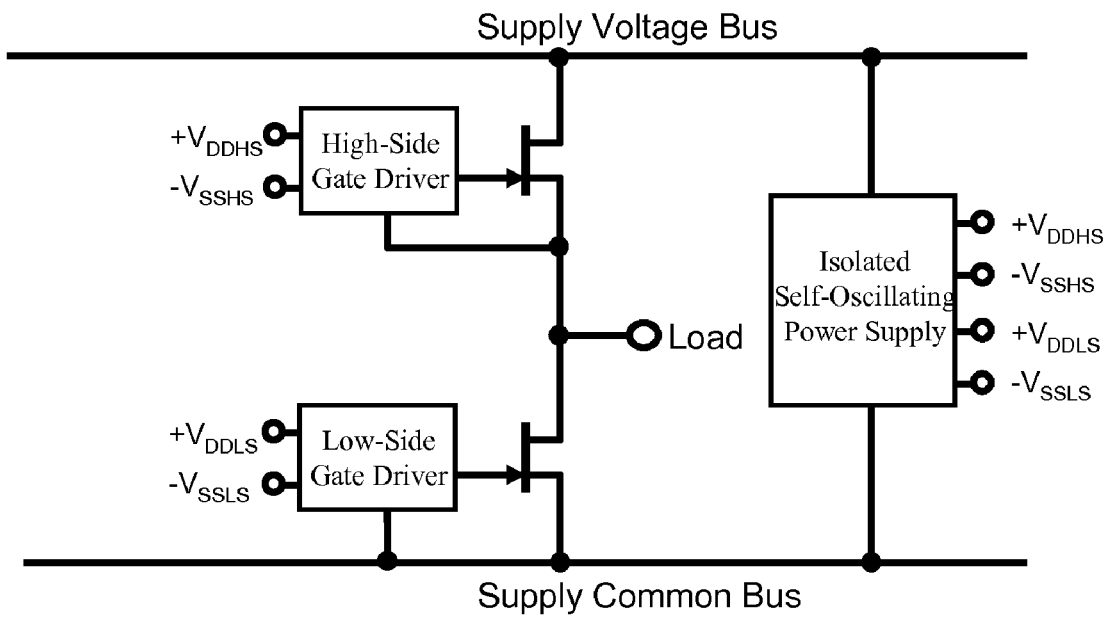
FIG. 4 is a schematic diagram of a power half-bridge circuit wherein the input to a single power supply is connected from the upper bus to the lower bus of the half-bridge module. This power supply derives two isolated outputs, one for the high-side JFET and one for the low-side JFET. The input-to-output characteristics of the power supply can be coordinated with the blocking characteristics of the JFET.

FIG. 4 illustrates an alternative embodiment in which a single power supply with appropriately coordinated input-to-output characteristics is used to derive the negative potential for both JFETs in the half bridge. The power supply in the device shown in FIG. 4 is isolated. The device depicted in FIG. 4 can be used in applications where the source of potential that can be applied to the JFETs in the half bridge is limited to the upper and the lower bus connections spanned by the half bridge. The configuration shown in FIG. 3 can be used in all power module applications. The device shown in FIG. 4 is suitable for many common applications and has the advantage of requiring only one power supply which may reduce cost and part count.

The power supply illustrated in FIG. 3 and FIG. 4 derives power to operate from the source of potential applied to either the drain-source terminals (FIG. 3) or the upper and lower buses (FIG. 4). In addition, the power supply depicted in FIGS. 3 and 4 will start oscillating automatically upon application of a voltage to its input.

Figure 5:
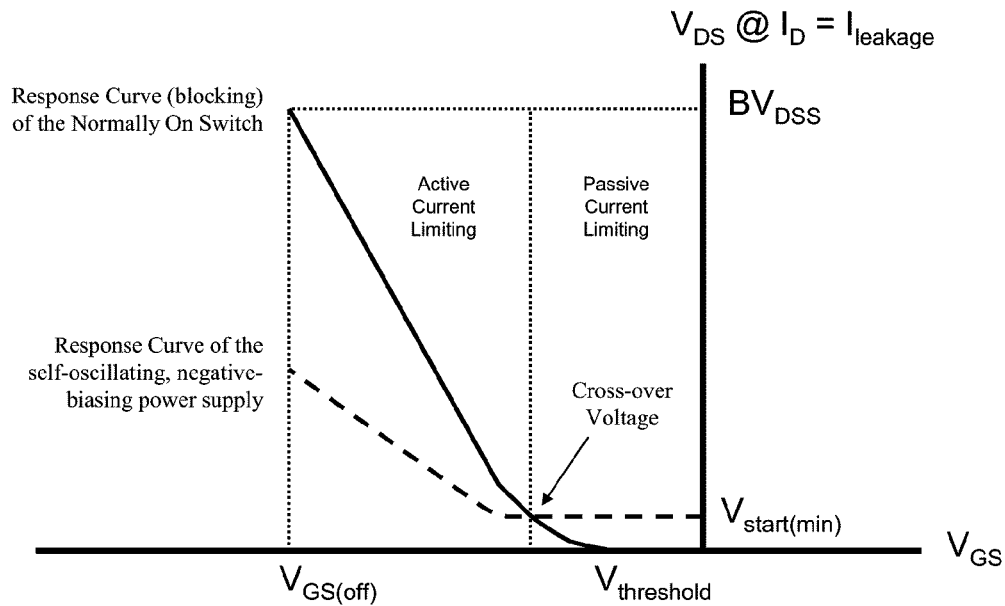
FIG. 5 is a graph showing coordination between the input-output characteristic of the power supply and the blocking characteristic of the corresponding normally on switch (e.g., JFET) protected by the power supply.

In addition, the input-to-output characteristics of the power supply can be coordinated with the semiconductor device or devices being protected. For example, the voltage that a vertical power JFET will block can be represented on a graph as illustrated in FIG. 5. On the horizontal axis or abscissa is plotted the potential applied across the gate to the source of the JFET. On the vertical axis or ordinate is plotted the potential applied across the drain to the source of the JFET when the specified leakage current flows into the drain. The solid curve on the graph traces the blocking characteristics of the JFET. The gate-source voltage can be positive or negative, but $V_{DS}@I_D=I_{leakage}$ increases monotonically as the gate-source voltage decreases. If $V_{GS}>V_{threshold}$ and $I_D$ is limited to $\leq I_{leakage}$, then no appreciable $V_{DS}$ can be blocked. The maximum voltage that the JFET can block is given by $BV_{DSS}$ which occurs when $V_{GS}=V_{GS(off)}$. A "normally on device" is generally one in which $V_{threshold}<0$. Even though it is a normally on device, it may not reach its full ability to conduct (i.e., exhibiting the minimum resistance to electrical current) until $V_{GS}>0$.

Superimposed on the graph in FIG. 5 is a dashed line which represents the input-to-output characteristics of the self-oscillating power supply. When a certain $V_{DS}$ is applied to the input of the power supply, it will generate an output that is applied to $V_{GS}$ by the gate driver circuit. The locus of ordered pairs of $V_{GS}$ and $V_{DS}$ is represented by the dashed line. According to some embodiments, coordination can be used to ensure that the dashed line falls below the solid line for the majority of applied $V_{DS}$. For the region where this is true, labeled "active current limiting" on the graph, it is certain that the applied $V_{DS}$ will produce a leakage current through the JFET that is less than $I_{leakage}$. In other words, over the range of $V_{GS}$ corresponding to active current limiting the JFET is safely in its non-conducting state, which means the current flowing through the JFET will be very small and inconsequential. The cross over voltage is defined as the boundary value of $V_{GS}$ separating the active current limiting mode from the passive current limiting mode.

When $V_{GS}$ is greater than the cross over voltage, the JFET is at least partly passively limiting the current. If the gate driver is not actively commanded by an external controller to bias the JFET to minimum on-resistance (i.e., turning the switch "ON"), then the gate driver design will inherently cause $V_{GS}=-V_{SS}\leq 0$. The design of gate drive circuits satisfying this requirement is simple and reliable, and known to those skilled in the art. When the JFET is passively limiting the current, it is dissipating more energy than when it is actively limiting the current. The locus of $V_{GS}$ vs. $V_{DS}$ produced by the power supply can be such that, when $V_{GS}$ is greater than the cross over voltage, the JFET will not overheat. To those skilled in the art, this means that the JFET remains within its safe operating area (SOA) at all times.

Figure 6:
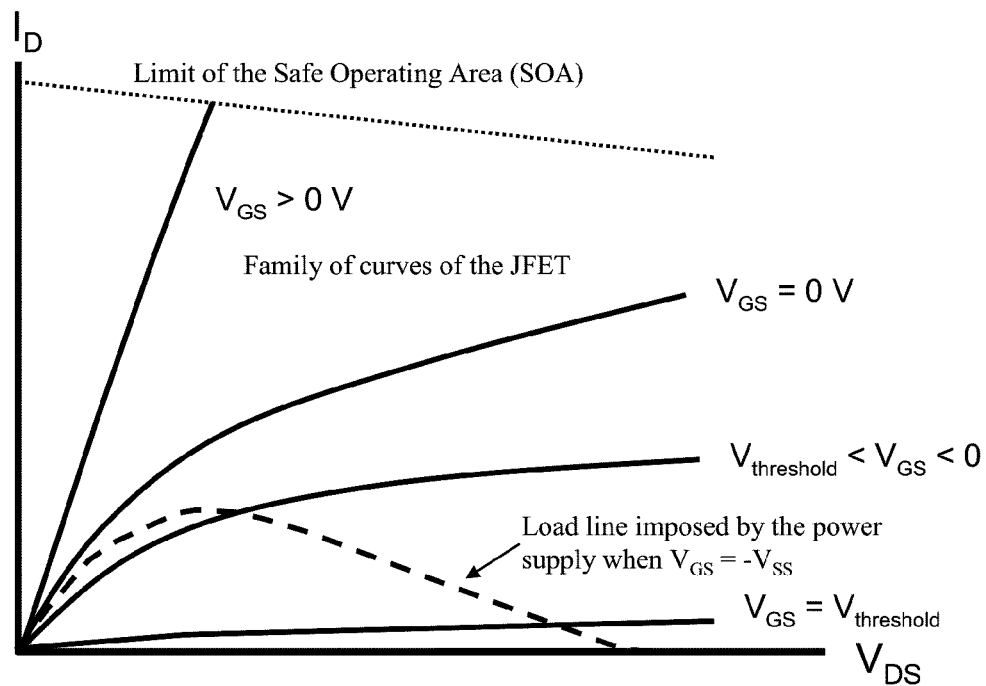
FIG. 6 is a further illustration of the coordination between the input-to-output characteristic of the power supply and the family of curves of the normally on JFET while the JFET is in the passive current limiting mode.

FIG. 6 illustrates the general condition under which safe passive current limiting will be achieved. The graph plots the JFET's drain current ($I_D$) on the ordinate and the drain-source voltage ($V_{DS}$) on the abscissa. A family of curves is drawn on the graph by graphing the ordered pairs of $I_D$ vs. $V_{DS}$ for a constant $V_{GS}$, and then incrementing $V_{GS}$ and redrawing the $I_D$ vs. $V_{DS}$ curve. In FIG. 6 it is assumed that $V_{GS}$ ranges from positive values to negative values and includes $V_{GS}=0$ V. The last curve plotted is that for $V_{GS}=V_{threshold}$. $V_{GS}=0$ V is another curve indicated on the graph. An example of a family of curves for a SiC JFET might cover $-4 V \leq V_{GS} \leq +3$ V. The more negative that $V_{GS}$ becomes, the more resistive the JFET becomes, which reduces $I_D$ at any given $V_{DS}$. As long as the gate driver is not commanded to switch the JFET ON, it will quiescently clamp $V_{GS}$ to $-V_{SS}$ (i.e., $V_{GS}=-V_{SS}$). Since the maximum value of $-V_{SS}=0$, then it is not possible for $I_D$ to fall on a line above the $V_{GS}=0$ V curve. In practice, even a modest $V_{DS}$ will cause $-V_{SS}<0$, thus $I_D$ must always fall on a line below that bounded by the $V_{GS}=0$ V curve. This limiting load line is plotted on the graph in FIG. 6 as a dashed line. By definition, the safe operating area (SOA) of a useful power switch will be bounded at low $V_{DS}$ by the rated maximum allowable current of the switch. This is also true for the JFET. In turn, the maximum allowable current will fall on the minimum resistance curve. In the case of a typical SiC JFET, the minimum resistance curve will occur well above the $V_{GS}=0$ V curve. For example, in the range $0 V<V_{GS}\leq +3$ V, as is illustrated in FIG. 6. As a result it is not possible while the gate driver clamps $V_{GS}=-V_{SS}$ for the drain current through the JFET to exceed that permitted by the SOA. In other words, while in the passive current limiting mode the current flowing through the JFET may not be very small, but it will be inconsequential from the standpoint of damaging the JFET provided that the application designer follows accepted design principals to ensure the application operates the JFET within its SOA.

Figure 7:
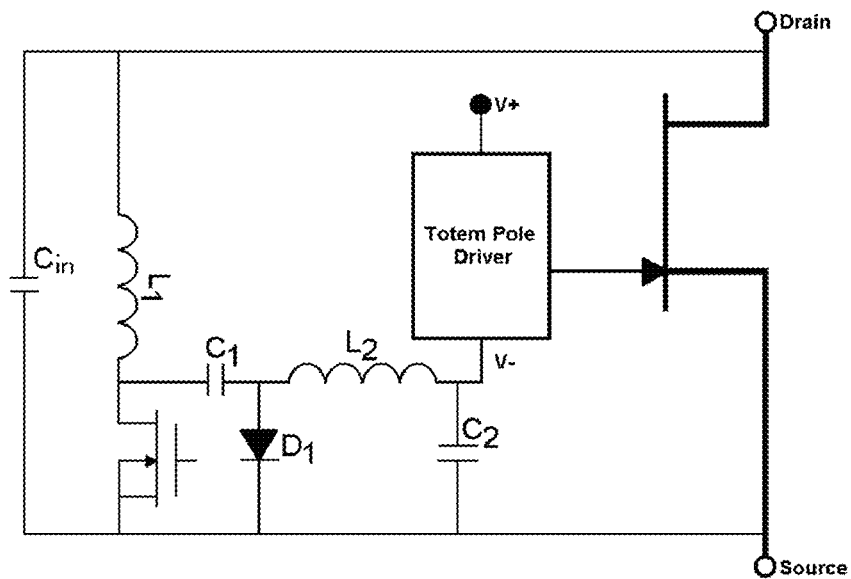
FIG. 7 is a schematic diagram of one physical implementation of the power supply based on a non-isolated Cuk converter that is connected across the drain-to-source terminals of the protected JFET.

Referring now to FIG. 7, a schematic diagram of a circuit including an exemplary and non-limiting embodiment of a self oscillating power supply is illustrated. This circuit is the Cuk converter useful for converting an input voltage into an output voltage that is smaller in magnitude and opposite in polarity. The circuit shown in FIG. 7 includes a normally-on switch having a gate, a source and a drain, and a Totem pole driver electrically coupled to the gate of the switch. The Totem pole driver has a positive supply voltage, V+, and a negative supply voltage, V−. The circuit also includes a first capacitor, $C_1$, a second capacitor, $C_2$, a first inductor, $L_1$, a second inductor $L_2$, and a diode $D_1$. The first inductor, $L_1$ is electrically connected between the drain of the switch and one terminal of the first capacitor $C_1$, where its other terminal is electrically connected to the anode of the diode $D_1$. The cathode of the diode $D_1$ is electrically connected to the source of the switch. The second inductor $L_2$ is electrically connected between the anode of the diode $D_1$ and the negative supply voltage V− of the Totem pole driver. The second capacitor, $C_2$ is electrically connected between the negative supply voltage V− of the Totem pole driver and the source of the switch. Additionally, the circuit further includes a third capacitor, $C_{in}$, electrically connected between the drain and source of the switch. The power supply shown in FIG. 7 is non-isolated. It is therefore suitable for use in the circuit illustrated in FIG. 3.

Figure 8:
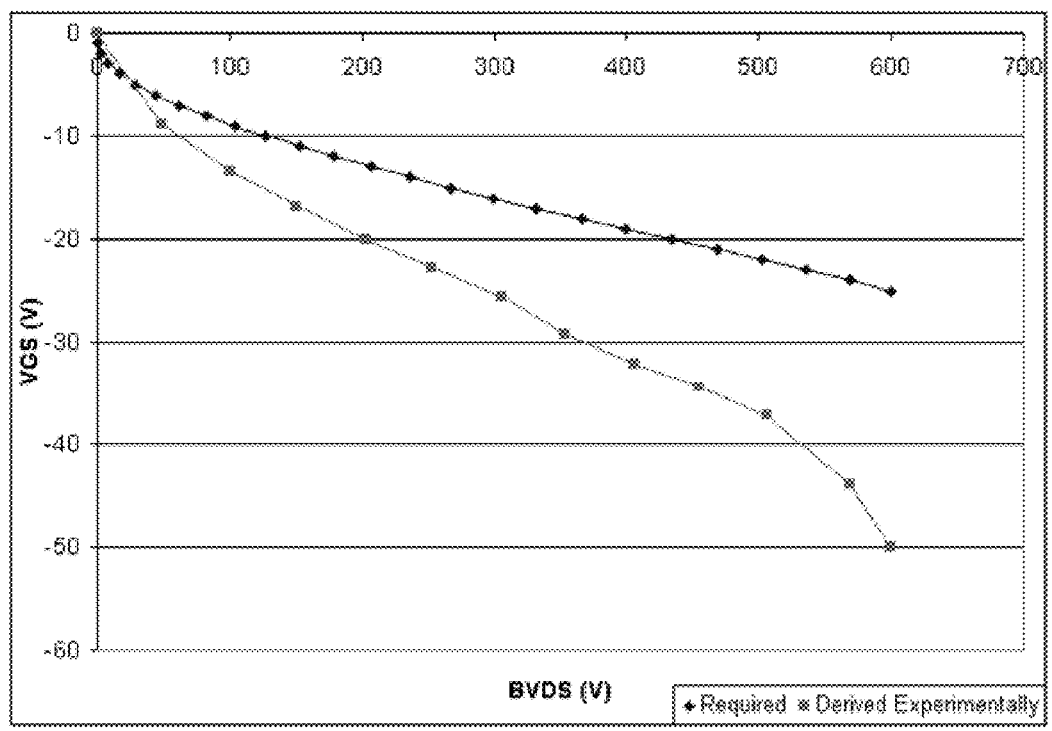
FIG. 8 is a plot of the experimental data measured using the physical implementation shown in FIG. 7. In the figure the data marked "required" refers to the experimental blocking characteristic curve of the SiC JFET being controlled by the gate drive. The data marked "derived experimentally" is the input-to-output characteristic of the power supply shown in FIG. 7.

As illustrated in FIG. 8, the power supply shown in FIG. 7 accepts a positive input voltage ranging from 0 to 600 V and converts it into a negative output voltage ranging from 0 to −50 V. The cross over voltage for this power supply occurs at approximately $V_{GS}$=−5 V which easily satisfies the safe operating area criteria for a SiC power JFET paired with the power supply.

Figure 9:
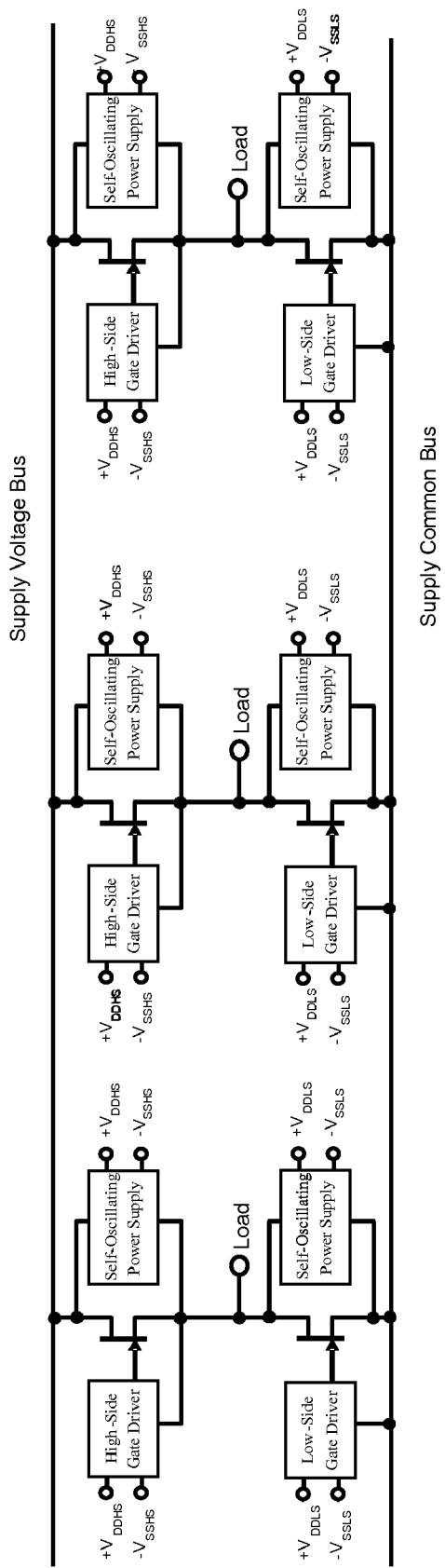
FIG. 9 is a schematic diagram of an electrical device comprising three circuits as shown in FIG. 3, arranged in parallel.

FIG. 9 is a schematic of an electrical device comprising three circuits as depicted in FIG. 3 arranged in parallel according to one embodiment. The device depicted in FIG. 9 can be a three-phase motor drive.

Figure 10:
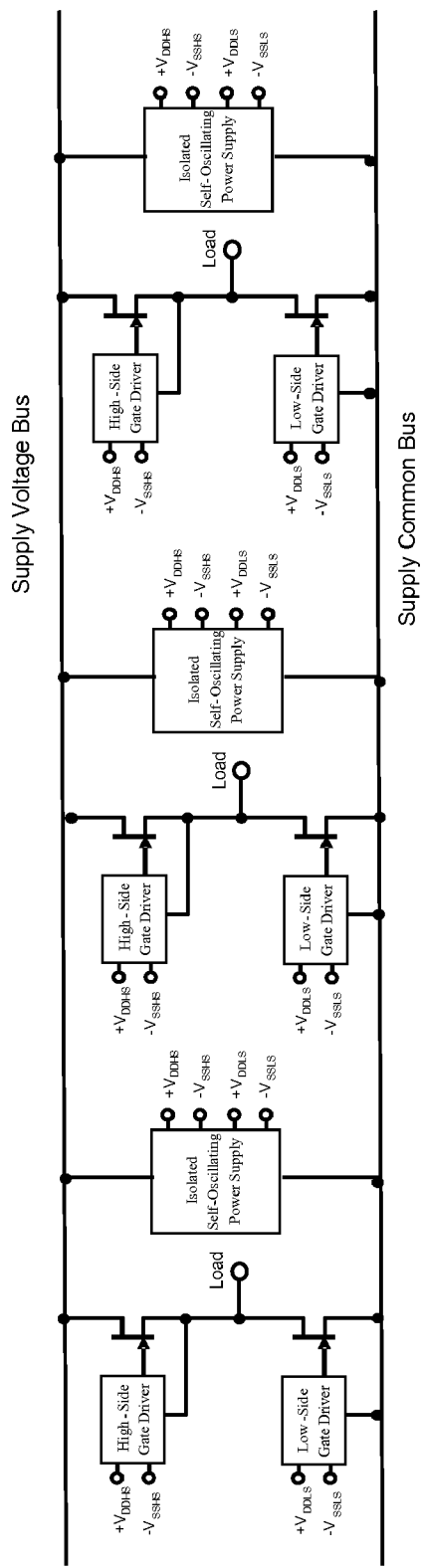
FIG. 10 is a schematic diagram of an electrical device comprising three circuits as shown in FIG. 4, arranged in parallel.

FIG. 10 is a schematic of an electrical device comprising three circuits as depicted in FIG. 4 arranged in parallel according to one embodiment. The device depicted in FIG. 10 can be a three-phase motor drive.

While the foregoing specification teaches the principles of the present invention, with examples provided for the purpose of illustration, it will be appreciated by one skilled in the art from reading this disclosure that various changes in form and detail can be made without departing from the true scope of the invention.

REFERENCES

[1] Issa Batarseh, *Power Electronic Circuits*. Wiley, ISBN 0-471-12662-4, 2004, pp. 224-225.

[2] Issa Batarseh, *Power Electronic Circuits*. Wiley, ISBN 0-471-12662-4, 2004, pp. 426-427.

[3] N. Mohan, T. M. Undeland, and W. P. Robbins, *Power Electronics*. Wiley, ISBN 0-471-58408-8, 1995, p. 225.

[4] S. Abedinpour and K. Shenai, "Insulated Gate Bipolar Transistor," *Power Electronics Handbook*, ed. M. Rashid. Academic Press, ISBN 0-12-581650-2, 2001, pp. 109-110.

[5] M. S. Mazzola, L. Cheng, J. Casady, D. Seale, V. Bondarenko, R. Kelley, and J. Casady, "Scalable SiC Power Switches for Applications in More Electric Vehicles," *Proc. of 6th Int. All Electric Combat Vehicle Conf.*, AECV 2005, Bath, England 13-16 Jun. 2005.

[6] H. Akagi, T. Sawae, and A. Nabae, "130 kHz 7.5 kW current source inverters using static induction transistors for induction heating applications," *IEEE Trans. Power Electronics*, vol. 3, no. 3, pp. 303-309, 1988.

What is claimed is:

1. A circuit comprising:
    a first normally-on switch having a source, a drain and a gate, the source of the first normally-on switch electrically connected to a load and the drain of the first normally-on switch electrically connected to a supply voltage;
    a second normally-on switch having a source, a drain, and a gate, the source of the second normally-on switch electrically connected to a common voltage and the drain of the second normally-on switch electrically connected to the load;
    a first gate driver electrically connected between the gate and the source of the first normally-on switch;
    a second gate driver electrically connected between the gate and the source of the second normally-on switch; and
    an oscillating power supply electrically connected across the voltage source and the common voltage, wherein the oscillating power supply is configured to power the first and second gate drivers such that, for a given voltage applied to the input of the oscillating power supply, the oscillating power supply generates a first output voltage which is supplied to the gate of the first normally-on switch by the first gate driver and a second output voltage which is supplied to the gate of the second normally-on switch by the second gate driver.

2. The circuit of claim 1, wherein the input-output characteristics of the oscillating power supply are coordinated with the characteristics of the first and second normally-on switches such that the first and second normally-on switches are in active current limiting mode over at least 50 percent of a voltage range of 0 to 600 V applied to the oscillating power supply.

3. The circuit of claim 1, wherein the input-output characteristics of the oscillating power supply are coordinated with the characteristics of the first and second normally-on switches such that the first and second normally-on switches are in active current limiting mode over at least 75 percent of a voltage range of 0 to 600 V applied to the power oscillating supply.

4. The circuit of claim 1, wherein the input-output characteristics of the oscillating power supply are coordinated with the characteristics of the first and second normally-on switches such that the first and second normally-on switches do not overheat when in passive current limiting mode.

5. The circuit of claim 1, wherein the first gate driver and the second gate driver each comprise a totem pole driver.

6. The circuit of claim 1, wherein the first normally-on switch and the second normally-on switch are JFETs.

7. The circuit of claim 1, wherein the oscillating power supply is a self-oscillating power supply.

8. The circuit of claim 7, wherein the oscillating power supply is isolated.

9. The circuit of claim 6, wherein the first normally-on switch and the second normally-on switch are each SiC JFETs.

10. An electrical device comprising at least one circuit as set forth in claim 1.

11. An electrical device comprising three circuits as set forth in claim 1 arranged in parallel, wherein the device is a three-phase motor drive.

* * * * *